US009018706B2

(12) United States Patent
Anderson et al.

(10) Patent No.: US 9,018,706 B2
(45) Date of Patent: Apr. 28, 2015

(54) MONOLITHIC MOSFET AND SCHOTTKY DIODE FOR MOBILE PHONE BOOST CONVERTER

(71) Applicant: Great Wall Semiconductor Corporation, Tempe, AZ (US)

(72) Inventors: Samuel J. Anderson, Tempe, AZ (US); David N. Okada, Chandler, AZ (US)

(73) Assignee: Great Wall Semiconductor Corporation, Tempe, AZ (US)

( * ) Notice: Subject to any disclaimer, the term of this patent is extended or adjusted under 35 U.S.C. 154(b) by 0 days.

(21) Appl. No.: 14/260,522

(22) Filed: Apr. 24, 2014

(65) Prior Publication Data

US 2014/0231901 A1  Aug. 21, 2014

Related U.S. Application Data

(63) Continuation of application No. 11/336,525, filed on Jan. 18, 2006, now abandoned.

(60) Provisional application No. 60/646,120, filed on Jan. 21, 2005.

(51) Int. Cl.
*H01L 29/78* (2006.01)
*H01L 27/06* (2006.01)
*H01L 27/02* (2006.01)
*H01L 29/06* (2006.01)

(52) U.S. Cl.
CPC .......... *H01L 29/782* (2013.01); *H01L 27/0629* (2013.01); *H01L 29/0692* (2013.01); *H01L 29/7835* (2013.01); *H01L 27/0255* (2013.01); *H01L 2924/0002* (2013.01)

(58) Field of Classification Search
CPC ............ H01L 27/0629; H01L 27/0255; H01L 29/7816; H01L 29/782
See application file for complete search history.

(56) References Cited

U.S. PATENT DOCUMENTS

| 4,866,495 | A | * | 9/1989 | Kinzer ......................... 257/337 |
| 5,068,700 | A | | 11/1991 | Yamaguchi et al. |
| 6,031,702 | A | | 2/2000 | Williams |
| 6,141,233 | A | * | 10/2000 | Nakamura ................ 363/21.06 |
| 6,870,223 | B2 | * | 3/2005 | Kumagai et al. ............ 257/343 |
| 2003/0127687 | A1 | | 7/2003 | Kumagai et al. |
| 2004/0159891 | A1 | * | 8/2004 | Nakamura et al. ............ 257/355 |
| 2005/0285188 | A1 | * | 12/2005 | Khemka et al. ............... 257/338 |

* cited by examiner

*Primary Examiner* — Allison P Bernstein
(74) *Attorney, Agent, or Firm* — Robert D. Atkins; Patent Law Group: Atkins and Associates, P.C.

(57) ABSTRACT

A cell phone has a plurality of interconnected electronic components for performing the electrical functions of the phone. A DC/DC converter provides an operating voltage which is applied to power supply terminals of the plurality of interconnected electronic components. The DC/DC converter uses a monolithic semiconductor device containing a power metal oxide semiconductor field effect transistor (MOSFET) and Schottky diode. The semiconductor device has the lateral diffused MOSFET formed on a surface of the semiconductor device. The MOSFET is formed with a plurality conduction fingers. The Schottky diode is also formed on the surface of the semiconductor device and integrated between the plurality of conduction fingers of the MOSFET. The drain of the MOSFET is connected to the anode of the diode on the surface of the monolithic semiconductor device.

20 Claims, 3 Drawing Sheets

MONOLITHIC MOSFET AND SCHOTTKY DIODE FOR MOBILE PHONE BOOST CONVERTER

CLAIM TO DOMESTIC PRIORITY

The present application is a continuation of U.S. application Ser. No. 11/336,525, filed Jan. 18, 2006, which claims the benefit of U.S. Provisional Application No. 60/646,120, filed Jan. 21, 2005, which applications are incorporated herein by reference.

FIELD OF THE INVENTION

The present invention relates in general to electronic circuits and semiconductor devices and, more particularly, to an integrated or monolithic MOSFET and Schottky diode for mobile phone boost converters.

BACKGROUND OF THE INVENTION

Most modern electronic equipment require a power supply to provide a direct current (DC) operating potential to the electronic components contained therein. Common types of electronic equipment which use DC power supplies include cell phones, personal computers, energy systems, telecommunication systems, audio-video equipment, consumer electronics, automotive components, and other devices which utilize integrated circuits, semiconductor chips, or otherwise require DC operating potential. Most, if not all, semiconductor components require a low voltage DC operating potential.

Not all semiconductor devices or electronic components operate with the same DC potential. Some integrated circuits (ICs) or discrete semiconductor devices require a higher DC supply voltage than others. A common approach in electronic systems requiring multiple DC operating voltage levels is to convert a base DC operating potential to other voltage levels. For example, the battery or main power supply to the electronic system may provide 3 volts DC. One or more DC/DC boost converters within the electronic system increase the voltage level to say 5 volts DC or 12 volts DC to supply power to certain components within the system.

The DC/DC boost converter uses an inductor or coil having a first terminal coupled to the converter input and power metal oxide semiconductor field effect transistor (MOSFET) coupled between a second terminal of the coil and ground. The conduction through MOSFET is controlled by a pulse width modulated (PWM) controller. The PWM controller turns on the power MOSFET to enable a current conduction path through the coil and thereby store energy in the coil. When the PWM controller turns off the power MOSFET, the energy stored in the coil is transferred through a Schottky diode to an output of the DC/DC boost converter. The output voltage of the converter is used to generate a feedback signal to the PWM controller to control the on-time of the power MOSFET and regulate the DC output voltage of the boost converter.

The power MOSFET and Schottky diode are typically discrete components in the DC/DC boost converter. In some electronic systems, such as cellular phones, space on the printed circuit board (PCB) is a premium. As cell phones reduce in feature size, the space required for discrete components becomes a design issue. In addition to surface area limitations, the need for low profile and small footprint semiconductor devices continues to grow as cell phones become thinner and smaller in design.

A need exists for semiconductor devices and packages that are compatible with electronic systems having limited surface areas and low profiles.

SUMMARY OF THE INVENTION

In one embodiment, the present invention is a monolithic semiconductor device including at least first, second, and third external terminals comprising a substrate and power MOSFET formed over the substrate. The power MOSFET includes a first set of drain fingers and source fingers separated by a first gate finger and a second set of drain fingers and source fingers separated by a second gate finger. The drain fingers are coupled to the first external terminal of the monolithic semiconductor device operating at a first potential. The source fingers are coupled to the second external terminal of the monolithic semiconductor device operating at a second potential which is different from the first potential. A first diode includes a cathode coupled to the first set of drain fingers and to the second set of drain fingers and anode coupled to the first set of source fingers and to the second set of source fingers. A semiconductor region is formed over the substrate. A second diode is formed as a metal layer over the semiconductor region and disposed between the first set of drain fingers and second set of drain fingers. The metal layer operates as an anode of the second diode coupled to the first external terminal of the monolithic semiconductor device. The semiconductor region operates as a cathode of the second diode coupled to the third external terminal of the monolithic semiconductor device operating at a third potential which is different than the first and second operating potentials.

In another embodiment, the present invention is a monolithic semiconductor device comprising a substrate, well region formed over the substrate, body formed in the well region, and first semiconductor region including a first conductivity type disposed in the body. The first semiconductor region is coupled to a first terminal of the monolithic semiconductor device operating at a first potential. A second semiconductor region includes the first conductivity type disposed in the well region adjacent to the body. The second semiconductor region is coupled to a second terminal of the monolithic semiconductor device operating at a second potential. A third semiconductor region includes the first conductivity type disposed in the well region. The third semiconductor region is coupled to a third terminal of the monolithic semiconductor device operating at a third potential which is different than the first and second operating potentials. A first metal layer is formed over the third semiconductor region and electrically connected to the second terminal of the monolithic semiconductor device.

In another embodiment, the present invention is a monolithic semiconductor device comprising a MOSFET formed on the monolithic semiconductor device. The MOSFET includes a drain region and source region separated by a gate region. The drain region is coupled to a first terminal of the monolithic semiconductor device operating at a first potential. The source region is coupled to a second terminal of the monolithic semiconductor device operating at a second potential which is less than the first potential. A first diode includes a cathode coupled to the drain region and anode coupled to the source region. A second diode is formed on the surface of the monolithic semiconductor device. The second diode includes an anode coupled to the first terminal of the monolithic semiconductor device and a cathode coupled to a third terminal of the monolithic semiconductor device operating at a third potential which is different than the first and second operating potentials.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Figure 1:
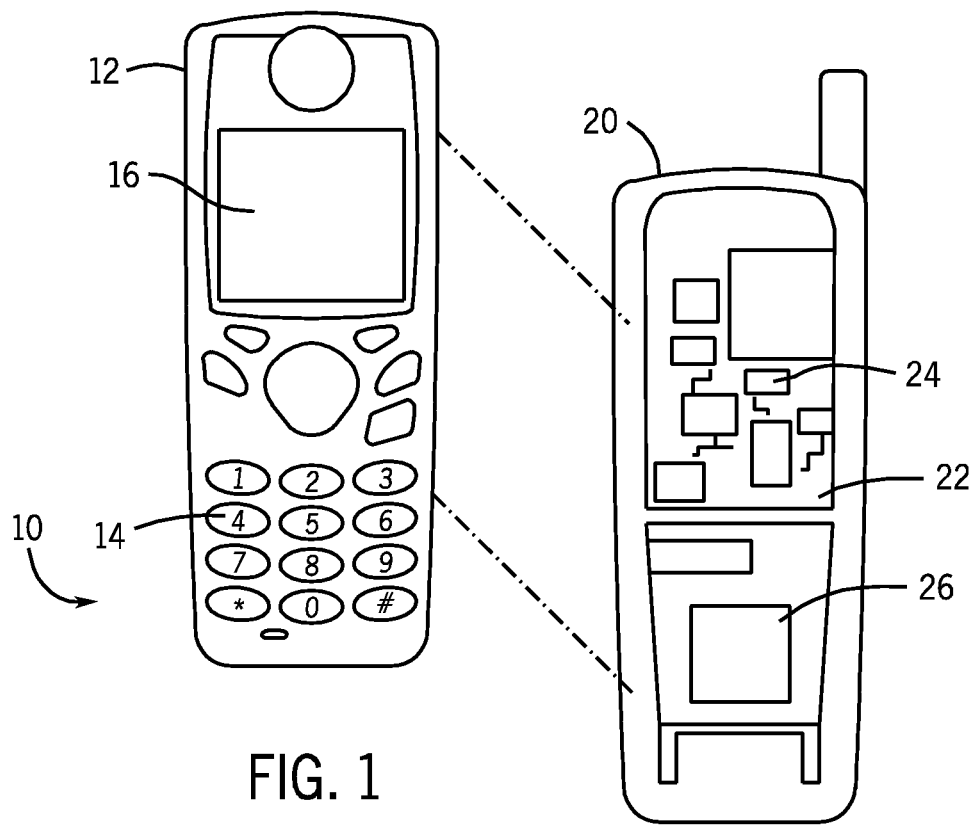
FIG. 1 illustrates a cellular telephone with a printed circuit board containing integrated circuits and semiconductor devices.

Referring to FIG. 1, a cellular phone 10 is shown having a front body 12 housing keyboard 14 and liquid crystal display (LCD) 16. Cell phone 10 further includes a rear body 20 housing PCB 22. PCB 22 is separated into radio frequency (RF) signal processing section 24 and digital signal processing section 26, separated by shielding. The RF signal processing section 24 includes electronic components such as RF amplifier, modulator, demodulator, oscillator, and power management. The RF signal processing section receives RF signals, downconverts, and demodulates the signals to baseband signals. The digital signal processing section 24 includes electronic components such as microprocessor, analog to digital converter, digital to analog converter, memory, and control logic. The digital signal processing section 26 processes the baseband information so the user can hear and speak over the cell phone.

Many of the electronic components on PCB 22 may require different DC operating potentials. Cell phone 10 has one lithium-ion battery source, e.g. 3.6 volts DC, attached to rear body 20. To convert the 3.6 VDC battery voltage to other operating potentials, one or more DC/DC boost converters are designed into PCB 22. The DC/DC boost converter generates DC operating potentials, e.g. 5 VDC or higher, for the electronic components which require a power supply different than the 3.6 VDC battery voltage.

The space limitations of PCB 22 in cell phone 10 dictate that the use of discrete components should be minimized and eliminated where possible. The semiconductor die or device within each discrete component is small compared to its overall package size. The same issue exists with other electronic systems having space limitations, such as radios, two-way pagers, digital recorders, laptop computers, compact disk players, compact video players, and the like. To support this design preference, in the following description, the power MOSFET and Schottky diode of the DC/DC boost converter are integrated into a single monolithic package.

In addition, other electronic systems that do not necessarily have space limitations, e.g. personal computers, energy systems, telecommunication systems, audio-video equipment, consumer electronics, and automotive components, can benefit from the cost savings and design efficiencies associated with the integration of discrete components.

Figure 2:
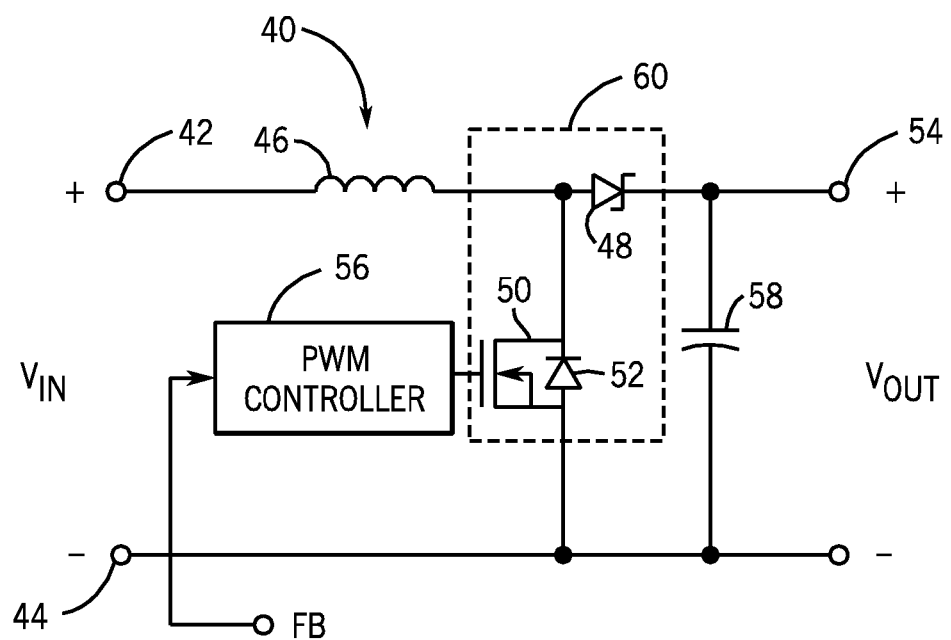
FIG. 2 is a schematic diagram of a DC/DC boost converter.

A DC/DC boost converter 40 is shown in FIG. 2. A DC input voltage $V_{IN}$ from the battery source is applied to input terminals 42 and 44. An inductor or coil 46 is coupled between terminal 42 and Schottky diode 48. An n-channel power MOSFET 50 has a drain terminal coupled to the anode of diode 48 and a source terminal coupled to terminal 44. MOSFET 50 is a 25V lateral diffused power MOSFET with a drain source resistance ($R_{Dson}$) of 0.25 ohms with gate voltage of 2.5 V. The total gate charge of MOSFET 50 is 0.5 nC (5V). Parasitic diode 52 is shown across the conduction terminals of power MOSFET 50. Diode 48 is a 25V Schottky diode with forward voltage drop less than 0.35V. The cathode of diode 48 is coupled to output terminal 54. Capacitor 58 is coupled across the output terminals of the converter for filtering and energy storage. DC/DC boost converter 40 provides DC output voltage $V_{OUT}$ having a voltage level different from $V_{IN}$. The DC output voltage $V_{OUT}$ is used to provide operating potential to one or more of the electronic components in RF signal processing section 24 and/or digital signal processing section 26.

The output voltage $V_{OUT}$ is used to generate a feedback (FB) signal, which is applied to PWM controller 56. PWM controller 56 generates a PWM control signal which is applied to the gate of power MOSFET 50. PWM controller 56 controls the conduction time of MOSFET 50 during each control cycle. If the output voltage $V_{OUT}$ falls, due to an increasing load, the duty cycle of the PWM control signal increases to lengthen the on-time of MOSFET 50 within the control cycle. Diode 48 is reversed biased to isolate the converter output during the on-state of the MOSFET. The longer conduction period of MOSFET 50 stores more energy in coil 46. During the off-time of the MOSFET, diode 48 becomes forward biased and the energy stored in coil 46 is transferred to the converter output to charge capacitor 58 and increases the output voltage $V_{OUT}$. If the output voltage $V_{OUT}$ rises, due to a decreasing load, the duty cycle of the PWM control signal decreases to shorten the on-time of MOSFET 50 during the control cycle. Again, diode 48 is reversed biased to isolate the converter output during the on-state of the MOSFET. The shorter conduction period of MOSFET 50 stores less energy in coil 46. During the off-time of the MOSFET, diode 48 becomes forward biased and the lesser amount of energy stored in coil 46 is transferred to the converter output to charge capacitor 58 so as to decrease the output voltage $V_{OUT}$.

In the present embodiment, power MOSFET 50 and Schottky diode 48 are integrated into a single, chip-scale, monolithic package 60 having a 1.15×1.15 square millimeter (mm$^2$) footprint. The height of package 60 is 0.8 mm to accommodate the low profile requirement. The power MOSFET occupies about 23% of the die area (0.28 mm$^2$), while the Schottky diode occupies about 60% of the die area (0.72 mm$^2$).

Figure 3:
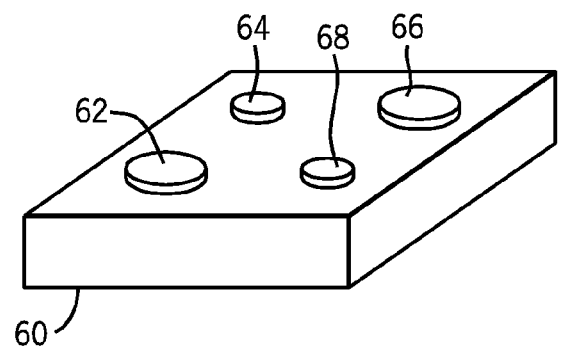
FIG. 3 is a monolithic integrated circuit package containing the power MOSFET and Schottky diode of FIG. 2.

As shown in FIG. 3, package 60 is a four-terminal flip-chip combo device containing power MOSFET 50 and Schottky diode 48. Bumps 62-68 are formed on the flip-chip package. Bump 62 is the source of power MOSFET 50 and is electrically coupled to ground terminal 44; bump 64 is the gate of power MOSFET 50 and is electrically coupled to the output of PWM controller 56; bump 66 is the common drain of power MOSFET 50 and anode of diode 48 and is electrically coupled to the second terminal of coil 46; bump 68 is the cathode of diode 48 and is electrically coupled to output terminal 54. Alternatively, in an IC package with external pins, e.g. SOP or DIP, the external connections from the semiconductor die to the package can be made by wire bonds.

Package 60 occupies significantly less space than conventional discrete components providing the same function. In fact, package 60 uses 68% less space on PCB 22 as compared to a conventional discrete MOSFET alone. The difference is more pronounced when taking into account a discrete Schottky diode and interconnecting PCB tracks. The small footprint and low profile of package 60 is applicable to systems requiring efficient and compact components, such as DC/DC boost converters used in cellular phones.

Figure 4:
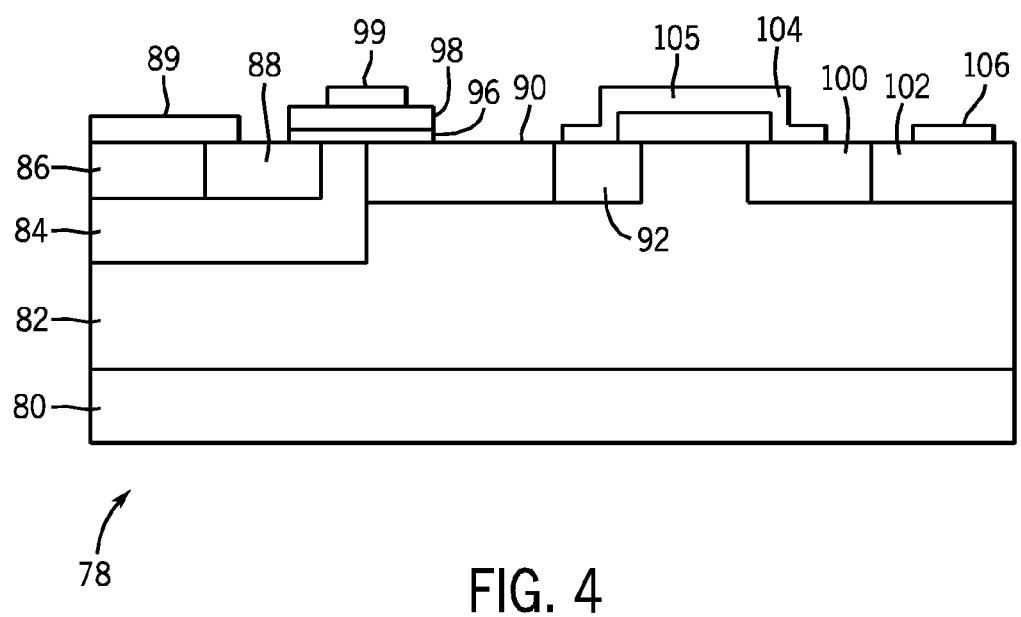
FIG. 4 is a cross-sectional view of the monolithic power MOSFET and Schottky diode.

Further detail of the monolithic semiconductor device 78 including power MOSFET 50 and Schottky diode 48 is shown in FIG. 4. The semiconductor device 78 uses a lateral double diffused MOSFET structure. The lateral double diffused power MOSFET 50 and Schottky diode 48 are formed on the surface of semiconductor device 78.

In the cross-sectional view, substrate 80 is made of p-type semiconductor material and provides structural support. The following regions and layers are formed on substrate 80 using semiconductor manufacturing processes understood by those skilled in the art. The manufacturing processes includes layering, patterning, doping, and heat treatment. In the layering process, materials are grown or deposited on the substrate by techniques involving thermal oxidation, nitridation, chemical vapor deposition, evaporation, and sputtering. Patterning involves use of photolithography to mask areas of the surface and etch away undesired material. The doping process injects concentrations of dopant material by thermal diffusion or ion implantation.

Using the above semiconductor manufacturing processes, a P– well region 82 is formed on substrate 80. A body region 84 made with P– material is formed over or above P– well region 82. P+ body 86 and N+ source region 88 are formed over or above P– body region 84. Terminal 89 is connected to N+ source region 88 to provide the source terminal of power MOSFET 50. Terminal 89 electrically connects to bump 62. An N– drift region 90 and N+ drain region 92 are formed above P– well region 82. Oxide layer 96 is formed over N+ source region 88, P– body region 84, and N– drift region 90. Gate region 98 is formed over oxide layer 96. Terminal 99 is coupled to gate region 98 to provide the gate terminal of power MOSFET 50. Terminal 99 electrically connects to bump 64.

Using the above semiconductor manufacturing processes, an N– drift region 100 and N+ region 102 are formed over or above P– well region 82. A metal layer 104 is formed over or above N– drift region 100 and further connects to N+ drain region 92 to provide terminal 105. Metal layer 104 may be made with titanium (Ti) or titanium nitride (TiN). The metal layer junction with the lightly doped N– drift region 100 forms the Schottky diode. The metal layer 104 contact to the heavier doped N+ drain region 92 forms an ohmic contact. Terminal 105 is the common terminal for the drain of power MOSFET 50 and the anode of diode 48. Terminal 106 is connected to N+ region 102 which forms the cathode of diode 48. Terminals 105 and 106 electrically connect to bumps 66 and 68, respectively.

Figure 5:
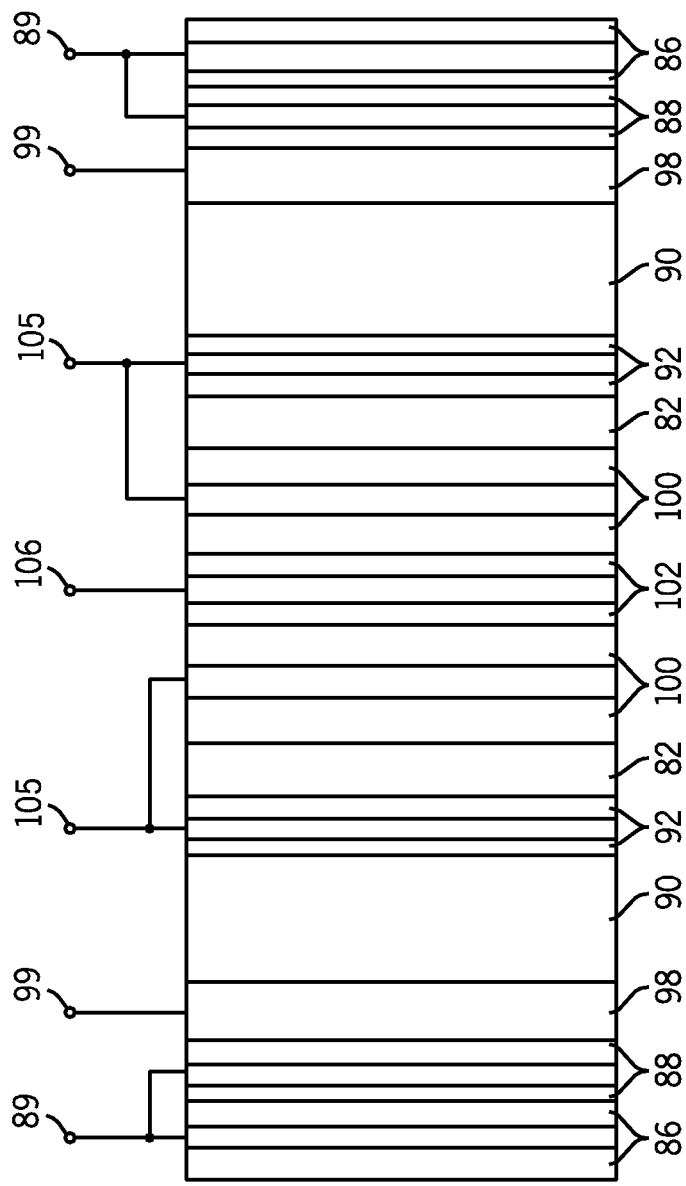
FIG. 5 is a top view of the monolithic power MOSFET and Schottky diode.

FIG. 5 illustrates a top view of a portion of semiconductor device 78. MOSFET 50 is formed with a repeating pattern of source and drain conduction fingers, i.e. source, drain, drain, source, source, drain, drain, source, etc. The N– drift regions 100 and N+ regions 102 of diode 48 are integrated between the repeating pattern of MOSFET conduction fingers for efficiency of space and design layout. In FIG. 5, the repeating pattern is shown as P+ body 86, N+ region 88 (source), gate region 98, N– drift region 90, N+ region 92 (drain), P– well region 82 (isolation), N– drift region 100 (anode), N+ region 102 (cathode), N– drift region 100 (anode), P– well region 82 (isolation), N+ region 92 (drain), N– drift region 90, gate region 98, N+ region 88 (source), and P+ body 86. The lateral diffused MOS structure provides access to the drain on the surface of the semiconductor device 78. The drain of power MOSFET 50 on the surface can be readily connected to the anode of diode 48 by terminal jumper 105.

In another application, diode 48 may be formed in semiconductor structure 78 as a Zener diode. The Zener diode would be formed in the surface of semiconductor structure 78 and be commonly connected to MOSFET 50 as described above.

While one or more embodiments of the present invention have been illustrated in detail, the skilled artisan will appreciate that modifications and adaptations to those embodiments may be made without departing from the scope of the present invention as set forth in the following claims.

What is claimed:

1. A monolithic semiconductor device including at least first, second, and third external terminals, comprising:
   a substrate;
   a power metal oxide semiconductor field effect transistor (MOSFET) formed over the substrate, the power MOSFET including a first set of drain fingers and source fingers separated by a first gate finger and a second set of drain fingers and source fingers separated by a second gate finger, the drain fingers being coupled to the first external terminal of the monolithic semiconductor device operating at a first potential, the source fingers being coupled to the second external terminal of the monolithic semiconductor device operating at a second potential which is different from the first potential;
   a first diode including a cathode coupled to the first set of drain fingers and to the second set of drain fingers and anode coupled to the first set of source fingers and to the second set of source fingers;
   a semiconductor region formed over the substrate; and
   a second diode formed as a metal layer over the semiconductor region and disposed between the first set of drain fingers and second set of drain fingers, the metal layer operating as an anode of the second diode coupled to the first external terminal of the monolithic semiconductor device, the semiconductor region operating as a cathode of the second diode coupled to the third external terminal of the monolithic semiconductor device operating at a third potential which is different than the first and second operating potentials.

2. The monolithic semiconductor device of claim 1, wherein the first gate finger and second gate finger are coupled to a fourth terminal of the monolithic semiconductor device.

3. The monolithic semiconductor device of claim 1, wherein the second diode includes a Schottky diode.

4. The monolithic semiconductor device of claim 1, wherein the semiconductor region includes:
   an n– drift region disposed under the metal layer; and
   an n+ semiconductor region disposed adjacent to the n– drift region, the n+ semiconductor region being coupled to the third terminal of the monolithic semiconductor device.

5. The monolithic semiconductor device of claim 1, wherein the drain fingers include a first semiconductor region and the source fingers include a second semiconductor region.

6. The monolithic semiconductor device of claim 5, further including a drift region disposed between the first semiconductor region and the second semiconductor region.

7. A monolithic semiconductor device, comprising:
   a substrate;
   a well region formed over the substrate;
   a body formed in the well region;
   a first semiconductor region including a first conductivity type disposed in the body, the first semiconductor region being coupled to a first terminal of the monolithic semiconductor device operating at a first potential;
   a second semiconductor region including the first conductivity type disposed in the well region adjacent to the body, the second semiconductor region being coupled to a second terminal of the monolithic semiconductor device operating at a second potential;
   a third semiconductor region including the first conductivity type disposed in the well region, the third semiconductor region being coupled to a third terminal of the monolithic semiconductor device operating at a third potential which is different than the first and second operating potentials; and
   a first metal layer formed over the third semiconductor region and electrically connected to the second terminal of the monolithic semiconductor device.

8. The monolithic semiconductor device of claim 7, further including:
   an insulating layer disposed over the body between the first and second semiconductor regions; and
   a second metal layer disposed over the insulating layer.

9. The monolithic semiconductor device of claim 8, wherein the second metal layer is coupled to a fourth terminal of the monolithic semiconductor device.

10. The monolithic semiconductor device of claim 7, wherein the first semiconductor region includes a plurality of drain fingers and the second semiconductor region includes a plurality of source fingers.

11. The monolithic semiconductor device of claim 10, wherein the first metal layer operates as an anode of a diode coupled to the second terminal of the monolithic semiconductor device and the third semiconductor region operates as a cathode of the diode coupled to the third terminal of the monolithic semiconductor device.

12. The monolithic semiconductor device of claim 11, wherein the diode is disposed between a first set of drain fingers and second set of drain fingers.

13. The monolithic semiconductor device of claim 7, wherein the third semiconductor region includes:
   an n− drift region disposed under the first metal layer; and
   an n+ semiconductor region disposed adjacent to the n− drift region, the n+ semiconductor region being coupled to the third terminal of the monolithic semiconductor device.

14. A monolithic semiconductor device, comprising:
   a metal oxide semiconductor field effect transistor (MOSFET) formed on the monolithic semiconductor device, the MOSFET including a drain region and source region separated by a gate region, the drain region being coupled to a first terminal of the monolithic semiconductor device operating at a first potential, the source region being coupled to a second terminal of the monolithic semiconductor device operating at a second potential which is less than the first potential;
   a first diode including a cathode coupled to the drain region and anode coupled to the source region; and
   a second diode formed on the surface of the monolithic semiconductor device, the second diode including an anode coupled to the first terminal of the monolithic semiconductor device and a cathode coupled to a third terminal of the monolithic semiconductor device operating at a third potential which is different than the first and second operating potentials.

15. The monolithic semiconductor device of claim 14, wherein the drain region includes a plurality of drain fingers and the source region includes a plurality of source fingers.

16. The monolithic semiconductor device of claim 14, wherein the gate region is coupled to a fourth terminal of the monolithic semiconductor device.

17. The monolithic semiconductor device of claim 14, wherein the drain region further includes a drift region.

18. The monolithic semiconductor device of claim 14, wherein the second diode is disposed between the first set of drain fingers and second set of drain fingers.

19. The monolithic semiconductor device of claim 14, further including a drift region disposed between the drain region and gate region.

20. The monolithic semiconductor device of claim 14, wherein the second diode includes a Schottky diode.

* * * * *